United States Patent [19]

Geenen et al.

[11] Patent Number: 4,748,493
[45] Date of Patent: May 31, 1988

[54] DIODE AND METAL STUD THEREFOR

[75] Inventors: Hendrikus H. Geenen; Gerardus E. Snijders, both of Maarheeze, Netherlands

[73] Assignee: U.S. Philips Corp., New York, N.Y.

[21] Appl. No.: 944,292

[22] Filed: Dec. 18, 1986

Related U.S. Application Data

[63] Continuation-in-part of Ser. No. 839,249, Mar. 13, 1986, abandoned.

[30] Foreign Application Priority Data

Nov. 5, 1985 [NL] Netherlands .......................... 8503023

[51] Int. Cl.⁴ ..................... H01L 29/46; H01L 23/54; H01L 21/447
[52] U.S. Cl. ......................................... 357/68; 357/67; 357/73; 357/65; 357/76
[58] Field of Search ....................... 357/73, 65, 67, 76, 357/74; 75/252

[56] References Cited

U.S. PATENT DOCUMENTS

| | | | |
|---|---|---|---|
| 3,698,055 | 10/1972 | Holtz, Jr. et al. | 75/252 |
| 3,927,815 | 12/1975 | Mase et al. | 357/74 |
| 3,996,602 | 12/1976 | Goldberg et al. | 357/73 |
| 4,485,150 | 11/1984 | Tsuno | 75/252 |

Primary Examiner—Andrew J. James
Assistant Examiner—S. V. Clark
Attorney, Agent, or Firm—Norman N. Spain

[57] ABSTRACT

A diode according to the invention comprises an electrically insulating envelope (2), within which a wafer (1) of semiconductor material with a pn junction is enclosed between metal studs (3, 4). The metal studs (3, 4) are sintered bodies mainly comprising tungsten, a metallic sintering activator and a material chosen from the group comprising $Y_2O_3$, $SiO_2$, $Al_2O_3$, $ZrO_2$ and $ThO_2$. The metal studs (3, 4) can be manufactured at a comparatively low temperature and nevertheless have a very high density and a very great strength as well as a fine structure.

8 Claims, 1 Drawing Sheet

DIODE AND METAL STUD THEREFOR

RELATED APPLICATIONS

This application is a continuation-in-part of application Ser. No. 839,249 filed Mar. 13, 1986 now abandoned.

The invention relates to a diode comprising an electrically insulating envelope, within which a semiconductor wafer with a pn junction is enclosed between metal studs, and current conductors which are connected to a respective metal stud and project beyond the envelope, the metal studs being sintered bodies mainly comprising tungsten and a metallic sintering activator; the invention further relates to a metal stud suitable for use in such a diode. Such a diode is known from Japanese Patent Application 58-75862 A (Touchou Kinzoku K.K. 1983-5-7).

Before sintering, less than 0.5% by weight of Ni has been added to the tungsten of the studs of the known diode. The addition renders it possible to sinter the studs at a lower temperature (1800°–1950° C.) than is the case in the absence of Ni. Without the addition of Ni, the sintering process should be effected at at least 2200° C. in order to be able to accomplish the operation within a reasonable period of about half an hour.

A disadvantage of the use of Ni as a sintering activator is that it leads to a considerably coarser structure of the sinter body, as also appears from photographs in the aforementioned Patent Application. It has been found that, when the structure becomes coarser, this leads to a reduction of the mechanical strength of the metal studs.

It is known from Japanese Patent Application 55-123135 A (Tokyo Shibaura Denki K.K., 1980-9-22) that tungsten sintered bodies can contain Fe or Co as a metallic sintering activator instead of Ni. Furthermore, it has been found that palladium is a suitable alternative.

SUMMARY OF THE INVENTION

The invention has for its object to provide (diodes with) sintered metal studs consisting mainly of tungsten, which can be readily manufactured and have a great strength.

According to the invention, this object can be achieved in a diode of the kind described in the opening paragraph and in metal studs suitable for this diode by also including a material chosen from the group comprising $Y_2O_3$, $SiO_2$, $Al_2O_3$, $ZrO_2$ and $ThO_2$ in the metal studs.

It has been found that a small quantity of this addition to the studs leads to a great strength and at the same time to a fine structure of the studs. This is also the case if the metallic sintering activator is present in a quantity which—according to the aforementioned Japanese Patent Application—is no longer permissible, such as 0.5% by weight or more.

BRIEF DESCRIPTION OF THE INVENTION

In the drawing

DETAILED DESCRIPTION OF THE INVENTION

Figure 1:
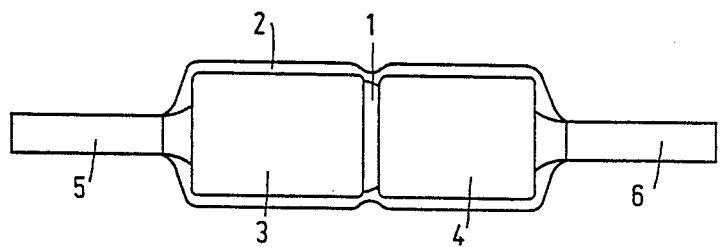
FIG. 1 is a cross-sectional view of an embodiment of a diode of the invention.

A favorable consequence of the presence of a mentioned oxide is that the metallic sintering activator (the metal promoting the sintering process) may be present in a comparatively large quantity, for example, in a quantity of 0.1–2% by weight, more particularly from 0.2 to 0.8% by weight.

In fact it has been found that a high density of the sintered studs and a great strength can be attained even at considerably lower temperature within a short period. A sintering temperature of about 1500° C., for example 1425°–1600° C., for about 15 to 30 minutes yields a density of 95% or more of the largest possible density (95% = 18.3 g/cm³).

The addition of a mentioned oxide substantially does not influence the electrical properties of the studs because a small quantity is sufficient. In general a quantity of 0.1 to 2% by weight is sufficient. As a rule, a quantity of from 0.2 to 1% by weight is amply sufficient.

Two embodiments of a diode in accordance with the invention are shown in the drawing in side elevation.

In FIG. 1, a wafer 1 of simiconductor material with a pn junction is enclosed within a glass envelope 2 between metal studs 3, 4 which are connected to a respective current conductors 5, 6 projecting beyond the envelope. In the embodiment shown, the glass envelope 2 keeps the studs 3, 4 pressed on both sides against the wafer 1.

Figure 2:
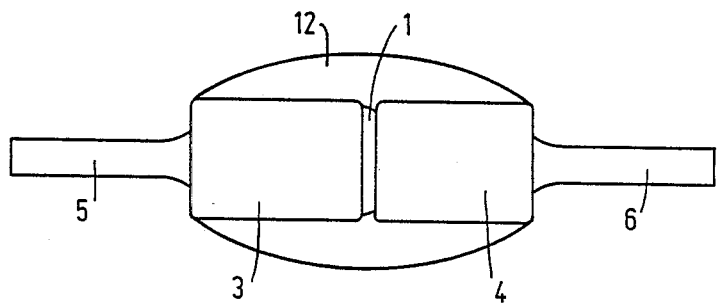
FIG. 2 is a cross-sectional view of an additional embodiment of the diode of the invention.

In FIG. 2 parts corresponding to those in FIG. 1 are designated by the same reference numerals except for the envelope. Thus Figure shows a drop diode, in which the glass envelope 12 is in the form of a drop. The studs 3, 4 are connected in this embodiment by means of solder to the wafer 1.

In both Figures the metal studs 3, 4 are sintered bodies mainly comprising tungsten and a metal promoting the sintering process and they also contain a material chosen from the group consisting of $Y_2O_3$, $Al_2O_3$, $SiO_2$, $ZrO_2$ and $ThO_2$.

The metal studs were obtained as follows.

Tungsten powder was incorporated in a solution of $Ni(NO_3)_2$ in demineralized water. The mixture was shaken for 2 hours and was then dried in vacuo at 100° C. Subsequently, the powder was incorporated in a $Y(NO_3)_3$ solution in water, shaken for 2 hours and then dried in vacuo. The powder was heated in hydrogen at 850° C. in order to convert the salts into Ni and $Y_2O_3$, respectively. The content of Ni, like that of $Y_2O_3$, was 0.5% by weight.

The powder obtained was mixed with a dry binder, was then incorporated in demineralized water and granulated. The granulate was sieved in order to isolate the fraction of 44–144 μm.

The granulate was pressed to mouldings, after which the mouldings were decarbonized in hydrogen/water vapour at 1000° C.

The mouldings were sintered to form studs by increasing the temperature from 1000° C. by 25° C. per minute to the final temperature and keeping the mouldings at this temperature for some time.

For comparison, tungsten studs were made in a similar manner which contained only 0.5% by weight of Ni.

The density was determined of both types of studs (i.e. containing and not containing $Y_2O_3$). This density is indicated, expressed in % of the largest possible density, in Table 1. Of those sinter bodies whose density was at least 95.0% the strength was determined. Table 1 indicates the pressure required for deforming the sintered bodies by 1%.

TABLE 1

| sintered at final temperature for (min.) | 1425° C. (%) | 1425° C. N/mm² | 1500° C. (%) | 1500° C. N/mm² | 1700° C. (%) | 1700° C. N/mm² |
|---|---|---|---|---|---|---|
| 0   0% Y₂O₃ | 87.2 |  | 93.9 |  | 95.7 | 741 |
| 0   0.5% Y₂O₃ | 92.9 |  | 96.3 | 1264 | 97.5 | 1019 |
| 15  0% Y₂O₃ | 92.2 |  | 96.3 | 797 | 96.1 | 699 |
| 15  0.5% Y₂O₃ | 95.2 | 1262 | 97.3 | 1162 | 97.4 | 999 |
| 30  0% Y₂O₃ | 93.9 |  | 96.8 | 774 | 96.3 | 705 |
| 30  0.5% Y₂O₃ | 95.0 | 1265 | 97.4 | 1169 | 97.7 | 938 |
| 60  0% Y₂O₃ | 94.6 |  | 96.6 | 775 |  |  |
| 60  0.5% Y₂O₃ | 95.7 | 1177 |  |  |  |  |

It appears from this Table that the studs containing $Y_2O_3$ always have a higher density than studs manufactured in a similar manner, but not containing $Y_2O_3$. It has always been found that the structure of the studs containing $Y_2O_3$ is considerably finer than that of studs not containing $Y_2O_3$.

It further appears from the Table that the studs containing $Y_2O_3$ have a considerably greater strength than studs manufactured in a similar manner, but not containing $Y_2O_3$.

It is further apparent from Table 1 that it is very favorable if the studs are sintered at a low temperature in the range from 1425° C. to 1500° C. Other metal studs were obtained in a manner slightly differing from the manner used to manufacture those described in Table 1.

Tungsten powder was impregnated with Ni(NO₃) or with Co(NO₃)₂ and subsequently dried as described herein before. The powder obtained was then impregnated with Y(NO₃)₃ or with Al(NO₃)₃ as described hereinbefore and dried at 70° C. in vacao. From the mixture obtained granules having a size of 44–144 μm were isolated by sieving.

The granules were compressed to form mouldings. The mouldings were heated in hydrogen at 850° C. in order to convert the salts into Ni, Co, $Y_2O_3$ and $Al_2O_3$ respectively.

The mouldings were sintered to form studs by increasing the temperature from 1000° C. by 25° C. per minute to the final temperature and keeping the mouldings for some time.

The density was determined of all the studs made and expressed in % of the largest possible density. The strength of the studs made was judged by determination of the failure load, the pressure at which the studs collapse. This strength is expressed in N/mm².

The results are represented in Tables 2–4. The quantities of Ni, Co, $Al_2O_3$ and $Y_2O_3$ are in % by weight.

TABLE 2

| sintered at final temp. of 1500° C. for (min) | Ni (%) | Y₂O₃ (%) | density (%) | strength (N/mm²) |
|---|---|---|---|---|
| 15 | 0,25 | 0,25 | 97,7 | 1266 |
| 15 | 0,5 | 0,25 | 97,3 | 1020 |
| 30 | 0,5 | 0,25 | 97,0 | 1011 |
| 15 | 0,5 | 0,5 | 97,2 | 1250 |
| 30 | 0,5 | 0,5 | 96,7 | 1265 |
| 15 | 0,5 | 1,0 | 96,7 | 1422 |
| 30 | 0,5 | 1,0 | 96,6 | 1415 |
| *15 | 0,5 | 0 | 95,6 | 768 |

*for comparison

TABLE 3

| sintered at final temp. of 1500° C. for (min) | Ni (%) | Al₂O₃ (%) | density (%) | strength (N/mm²) |
|---|---|---|---|---|
| 0 | 0,5 | 0,5 | 95,7 | 1470 |
| 15 | 0,5 | 0,5 | 96,9 | 1206 |
| *15 | 0,5 | 0 | 95,6 | 768 |

*for comparison

TABLE 4

| sintered at final temp. of 1550° C. for (min) | Co (%) | Y₂O₃ (%) | density (%) | strength (N/mm²) |
|---|---|---|---|---|
| 15 | 0,5 | 0,5 | 95,0 | 1521 |
| 30 | 0,5 | 0,5 | 95,6 | 1564 |
| *15 | 0,5 | 0 | 92,8 |  |

*for comparison

From Table 2 it appears that a quantity of $Y_2O_3$ as low as 0.25% by weight suffices to yield studs having a very high density and strength. These parameters are highest in case an equal amount of Ni is present. The density and the strength of all studs are considerably improved as compared to the reference studs, which do not contain $Y_2O_3$. The structure of studs containing $Y_2O_3$ is finer than the structure of studs not containing $Y_2O_3$. The higher ratio's of $Y_2O_3$ and Ni yield the finer structure.

Table 3 shows that studs having a high density and a very high strength are obtainable when in addition to Ni $Al_2O_3$ is present. The studs have much finer structure than studs lacking $Al_2O_3$.

From Table 4 it appears that studs having a much higher density and a very high strength are obtained when $Al_2O_3$ is added in addition to Co. The studs of the invention have a very fine structure. The density of the reference studs lacking $Al_2O_3$ is unacceptably low.

Diodes were manufactured from studs prepared by sintering tungsten powder containing nickel at 1500° C. or cobalt at 1550° C., both during 15 minutes. The electrical conductivity of the diodes was compared with the conductivity of diodes having sintered studs consisting of tungsten and 0,5% of nickel, and of diodes having studs of drawn tungsten wire. The conductivity, both at 25° C. and at 165° C., was measured by determination of the voltage drop over the diodes when a current was passed through the diodes of 1 mA or of 100 mA.

The results of these tests are represented in Table 5.

TABLE 5

| diode having studs of tungsten and | 1 mA 25° C. | 1 mA 165° C. | 100 mA 25° C. | 100 mA 165° C. |
|---|---|---|---|---|
| 0,5% Ni 0,5% Y₂O₃ | 1,74 | 0,79 | 2,45 | 1,76 |
| 0,5% Ni 0,5% Al₂O₃ | 1,74 | 0,79 | 2,45 | 1,75 |
| 0,5% Co 0,5% Y₂O₃ | 1,71 | 0,73 | 2,44 | 1,75 |
| 0,25% Ni 0,25% Y₂O₃ | 1,73 | 0,78 | 2,44 | 1,74 |
| 0,5% Ni 0,25% Y₂O₃ | 1,74 | 0,79 | 2,45 | 1,76 |
| 0,5% Ni 1% Y₂O₃ | 1,74 | 0,78 | 2,45 | 1,75 |
| *0,5% Ni | 1,73 | 0,78 | 2,45 | 1,76 |
| *tungsten wire | 1,75 | 0,79 | 2,45 | 1,74 |

*for comparison

From these data it is concluded that the addition of $Y_2O_3$ or $Al_2O_3$ does not significantly influence the electrical conductivity of diodes having studs containing said oxides.

The roughness of the studs according to the invention is always smaller than the maximum permissible roughness of 5 μm.

What is claimed is:

1. A diode comprising an electrically insulating envelope, within which a wafer of semiconductor material with a pn junction is enclosed between metal studs, and current conductors which are connected to a respective metal stud and project beyond the envelope, the metal studs being sintered bodies mainly comprising tungsten and a metallic sintering activator, characterized in that the metal studs further contain an oxidic material chosen from the group consisting of $Y_2O_3$, $SiO_2$, $Al_2O_3$, $ZrO_2$ and $ThO_2$.

2. A metal stud suitable for the diode claimed in claim 1 comprising a sintered body mainly comprising tungsten and the metallic sintering activator, characterized in that the metal studs further contain an oxidic material chosen from the group consisting of $Y_2O_3$, $SiO_2$, $Al_2O_3$, $ZrO_2$ and $ThO_2$.

3. The diode of claim 1 wherein the sintering activator is selected from the group consisting of nickel and cobalt.

4. The metal stud of claim 2 wherein the sintering activator is selected from the group consisting of nickel and cobalt.

5. The diode of claim 3 wherein the oxidic material is present in an amount of from 0.1 to 2% by weight.

6. The diode of claim 5 wherein the oxidic material is present in an amount of from 0.2 to 1% by weight.

7. The metal stud of claim 4 wherein the acidic material is present in an amount from 0.1 to 2% by weight.

8. The metal stud of claim 7 wherein the acidic material is present in an amount from 0.2 to 0.8% by weight.

* * * * *

UNITED STATES PATENT AND TRADEMARK OFFICE
CERTIFICATE OF CORRECTION

PATENT NO. : 4,748,493

DATED : May 31, 1988

INVENTOR(S) : HENDRIKUS H. GEENEN ET AL

It is certified that error appears in the above-identified patent and that said Letters Patent is hereby corrected as shown below:

Column 6 - Line 13:  . . . "acidic" . . should read "oxidic"

Column 6 - Line 15:  . . . "acidic" .. should read "oxidic"

Signed and Sealed this

Third Day of January, 1989

Attest:

DONALD J. QUIGG

Attesting Officer

Commissioner of Patents and Trademarks